US012607946B2

(12) United States Patent
Tinnemans et al.

(10) Patent No.: US 12,607,946 B2
(45) Date of Patent: Apr. 21, 2026

(54) METROLOGY METHOD AND ASSOCIATED METROLOGY AND LITHOGRAPHIC APPARATUSES

(71) Applicant: ASML Netherlands B.V., Veldhoven (NL)

(72) Inventors: Patricius Aloysius Jacobus Tinnemans, Hapert (NL); Leendert Jan Karssemeijer, 's Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 106 days.

(21) Appl. No.: 18/596,499

(22) Filed: Mar. 5, 2024

(65) Prior Publication Data

US 2024/0210844 A1 Jun. 27, 2024

Related U.S. Application Data

(63) Continuation of application No. PCT/EP2022/071708, filed on Aug. 2, 2022.

(30) Foreign Application Priority Data

Sep. 8, 2021 (EP) .................................... 21195563

(51) Int. Cl.
 *G03F 9/00* (2006.01)
 *G03F 7/00* (2006.01)
(52) U.S. Cl.
 CPC ........ *G03F 9/7092* (2013.01); *G03F 7/70508* (2013.01); *G03F 9/7046* (2013.01); *G03F 9/7088* (2013.01)

(58) Field of Classification Search
 CPC .. G03F 7/705; G03F 7/70508; G03F 7/70616; G03F 7/70633; G03F 7/7065;
 (Continued)

(56) References Cited

U.S. PATENT DOCUMENTS 6,961,116 B2 11/2005 Den Boef et al.
2006/0033921 A1 2/2006 Den Boef et al.
(Continued)

FOREIGN PATENT DOCUMENTS

WO WO 2009/078708 A1 6/2009
WO WO 2009/106279 A1 9/2009
(Continued)

OTHER PUBLICATIONS

International Search Report issued in related International Application No. PCT/EP2022/071708, mailed Dec. 16, 2022 (2 pgs.).
(Continued)

*Primary Examiner* — Peter B Kim
(74) *Attorney, Agent, or Firm* — FINNEGAN, HENDERSON, FARABOW, GARRETT & DUNNER, LLP

(57) ABSTRACT

Disclosed is a method of determining a substrate deformation metric relating to at least one substrate, the substrate deformation metric describing deformation across the at least one substrate. The method comprises obtaining alignment data relating to measurement of a plurality of structures on said substrate using a plurality of illumination conditions; and determining substrate deformation metric values for the substrate deformation metric which minimizes the number of basis vectors which are required to expand dispersion due to structure deformation of said plurality of structures.

18 Claims, 3 Drawing Sheets

(58) Field of Classification Search
CPC ......... G03F 7/706837; G03F 7/706849; G03F
9/7046; G03F 9/7088; G03F 9/7092;
G03F 9/7093
See application file for complete search history.

(56) References Cited

U.S. PATENT DOCUMENTS

| | | |
|---|---|---|
| 2006/0066855 A1 | 3/2006 | Boef et al. |
| 2009/0195768 A1 | 8/2009 | Bijnen et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2015/0355554 A1 | 12/2015 | Mathijssen |
| 2016/0246185 A1 | 8/2016 | Ypma et al. |
| 2019/0094721 A1 | 3/2019 | Tinnemans et al. |
| 2019/0107781 A1 | 4/2019 | Tinnemans et al. |
| 2021/0397103 A1* | 12/2021 | Andersson .......... G03F 7/70633 |

FOREIGN PATENT DOCUMENTS

| | | | | |
|---|---|---|---|---|
| WO | WO 2013/178422 A1 | 12/2013 | | |
| WO | WO-2015051970 A1 * | 4/2015 | .......... | G03F 9/7088 |
| WO | WO 2021/122016 A1 | 6/2021 | | |

OTHER PUBLICATIONS

Bechhoefer et al., "Kramers-Kronig, Bode, and the meaning of zero," American Journal of Physics 79, 1053 Jun. 30, 2011 (8 pages).

Bhattacharyya et al., "A study of swing-curve physics in diffraction-based overlay," Proc. of SPIE 9778, Metrology, Inspection, and Process Control for Microlithography XXX, 97781I, 2016 (6 pages).

Lucas et al., "A fast Fourier transform implementation of the Kramers-Kronig relations: Application to anomalous and left handed propagation," AIP Advances 2, 032144, 2012, Research Article | Aug. 17, 2012, Received May 22, 2012; accepted Aug. 10, 2012; published online Aug. 17, 2012 (12 pages).

* cited by examiner

1

METROLOGY METHOD AND ASSOCIATED METROLOGY AND LITHOGRAPHIC APPARATUSES

CROSS-REFERENCE TO RELATED APPLICATIONS

This application claims priority of International application PCT/EP2022/071708, filed on 2 Aug. 2022, which claims priority of EP application 21195563.8, filed on 8 Sep. 2021. These applications are incorporated herein by reference in their entireties.

FIELD

The embodiments of the present disclosure relate to methods and apparatus usable, for example, in the manufacture of devices by lithographic techniques, and to methods of manufacturing devices using lithographic techniques. More particularly, they relate to metrology sensors and lithography apparatuses having such a metrology sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A. US20120123581A. US20130258310A. US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in some scatterometers or alignment sensors, imperfections in metrology targets can result in a wavelength/polarization dependent variation in a measured value from that target. As such, correction and/or mitigation for this variation is sometimes effected by performing the same measurement using multiple different wavelengths and/or polarizations (or more generally, multiple different illumination conditions). It would be desirable to improve one or more aspects of measuring using multiple illumination conditions.

SUMMARY

The embodiments of the present disclosure provide a method of determining a substrate deformation metric relating to at least one substrate, the substrate deformation metric describing deformation across the at least one substrate, the method comprising: obtaining alignment data relating to measurement of a plurality of structures on said substrate using a plurality of illumination conditions; and determining substrate deformation metric values for the substrate deformation metric which minimizes the number of basis vectors which are required to expand dispersion due to structure deformation of said plurality of structures.

Also disclosed is a computer program, alignment sensor and a lithographic apparatus being operable to perform the method of the first aspect.

The embodiments of the present disclosure will be understood from a consideration of the examples described below.

BRIEF DESCRIPTION OF THE DRAWINGS

Embodiments will now be described, by way of example only, with reference to the accompanying drawings, in which.

DETAILED DESCRIPTION OF EMBODIMENTS

Before describing various embodiments in detail, it is instructive to present an example environment in which embodiments of the present disclosure may be implemented.

Figure 1:
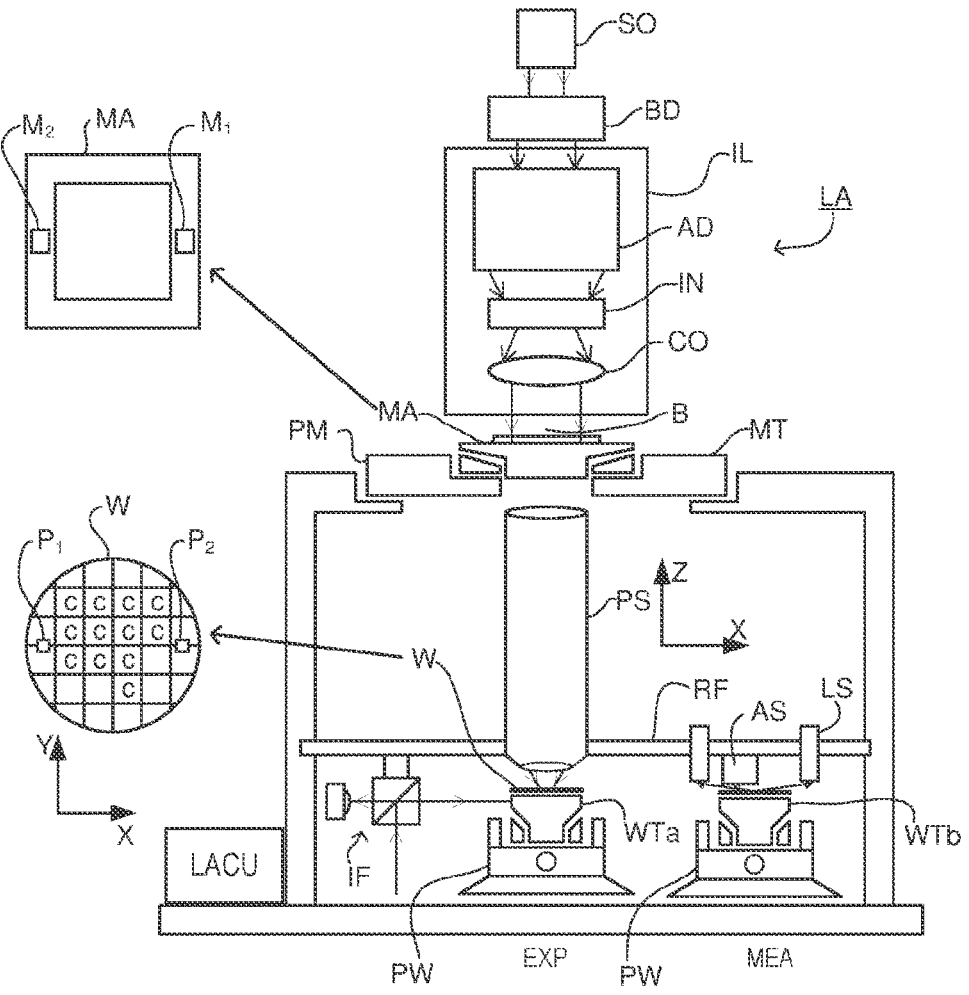
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
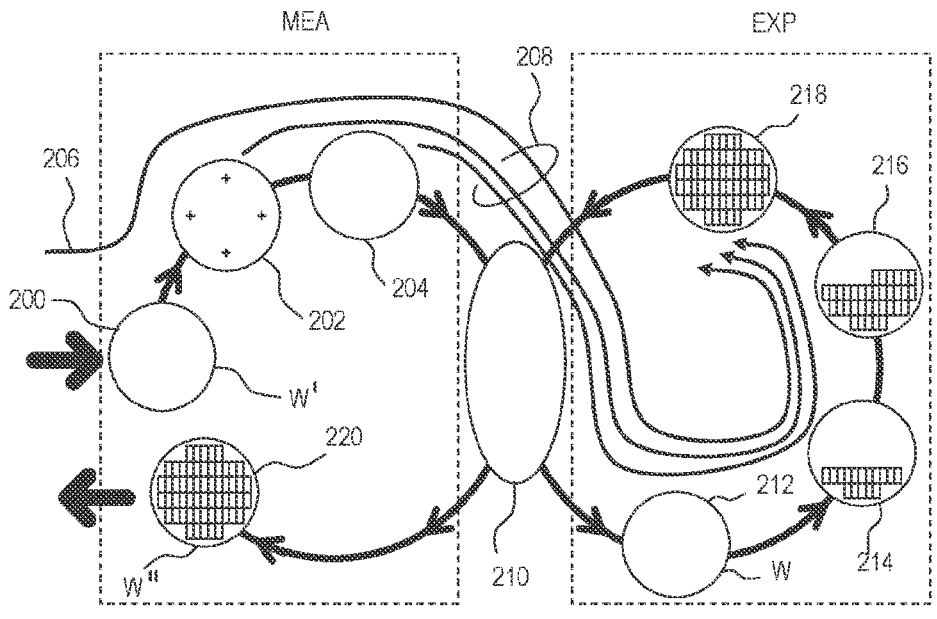
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a dry tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one example to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W. W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W'" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or –45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
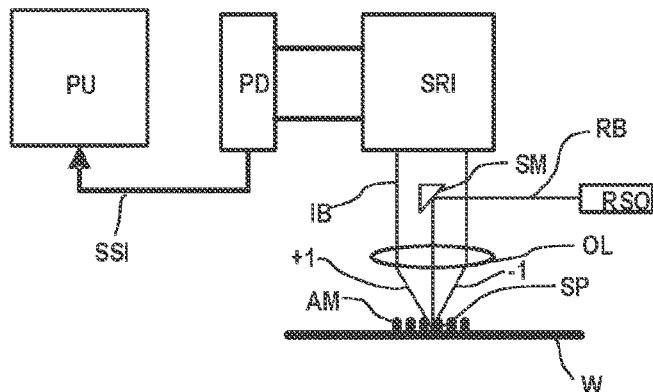
FIG. 3 is a schematic illustration of an alignment sensor adaptable according to some embodiments of the present disclosure.

FIG. 3 is a schematic block diagram of an example of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include complementary higher diffracted orders; e.g.: +1 and –1 diffracted orders (labelled +1, –1) and optionally zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

SRI Intensity signals SSI are supplied to a processing unit PU. By a combination of optical processing in the self-referencing interferometer SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

In the context of wafer alignment, the following approaches are in use or have been proposed to correct the mark position for mark asymmetry (asymmetry in the alignment mark which results in a position error or offset): OCW (Optimal Color Weighing—described in more detail in US publication US2019/0094721 A1 which is incorporated herein by reference), OCIW (Optimal Color and Intensity Weighing—described in more detail in PCT publication WO 2017032534 A2) and WAMM (Wafer Alignment Model Mapping—described in more detail in PCT publications WO 2019001871 A1 and WO 2017060054 A1). In each of these cases, training to reference data is needed or desired. This means that these corrections can only be accurately performed if sufficient training data is available and if the process variations in the training data are representative for the variations in the wafers that need to be corrected. This reference data may be measured by a reference sensor, e.g. hindsight overlay data.

To address this, it has been proposed to use a dispersion model(s) and/or dispersion equation(s) and/or dispersion approximation(s), such as the Forouhi-Bloomer dispersion equation(s)/approximation(s), a Lorentz oscillator based dispersion model, one or more Kramers-Kronig dispersion relations and/or one or more Plemelj dispersion relations, to convert measured intensity asymmetry information (typically measured for a limited number of wavelengths) in a position correction for mark asymmetry. Such methods are disclosed in WO2021/122016, which is incorporated herein by reference. Such methods may comprise mathematically calculating the intensity asymmetry value into a phase offset value corresponding to mark asymmetry (e.g., calculating the phase offset from intensity asymmetry using physics principles). This may be implemented on an alignment sensor (but alternatively also on an overlay sensor, a focus sensor and/or a leveling sensor) having a functionality to measure the intensity of the positive diffraction order and of the negative diffraction order. As such, the intensity measurements in this context relate to the diffracted orders +1, −1 (and not SRI intensity signals SSI of FIG. 3). This dispersion model(s) and/or dispersion equation(s) and/or dispersion approximation(s) based approach results in a physics first principles based approach, the benefit of which is that it avoids (or at least partially) the need for a training to reference data obtained by a sensor other than the alignment sensor itself.

Asymmetry in an alignment mark results in a phase offset which is additional to the position information encoded in the phase data measured by the alignment sensor. The intensity asymmetry is resultant only from the mark asymmetry. Therefore, the method proposed herein may use a dispersion model per diffraction order (e.g., +1 and −1 diffraction order) to describe the measured intensity asymmetry (or related parameter such as amplitude asymmetry), but alternatively diffractions orders pairs might also be combined, e.g., summed or subtracted. By fitting the dispersion models to the measured intensity data (e.g., for a number of illumination conditions such as wavelengths/polarizations or combinations thereof), an estimate for a phase offset (per wavelength or common to all wavelengths) which is equivalent to the intensity/amplitude asymmetry can be determined. This phase offset can be used to determine a corresponding position offset or correction. Measurement of intensity asymmetry at different illumination conditions may be performed in parallel or sequentially.

Note that any mention of determining a phase offset value or phase offset can be read as determining a position correction as the terms are synonymous.

Determining a generic dispersion model may comprise modeling the change in refractive index (or similar parameter) against wavelength/polarization (or propagation direction in the material) for each target using the measurement data from each wavelength and polarization combination. The model may then comprise a model of the target as a transmission function.

Figure 4:
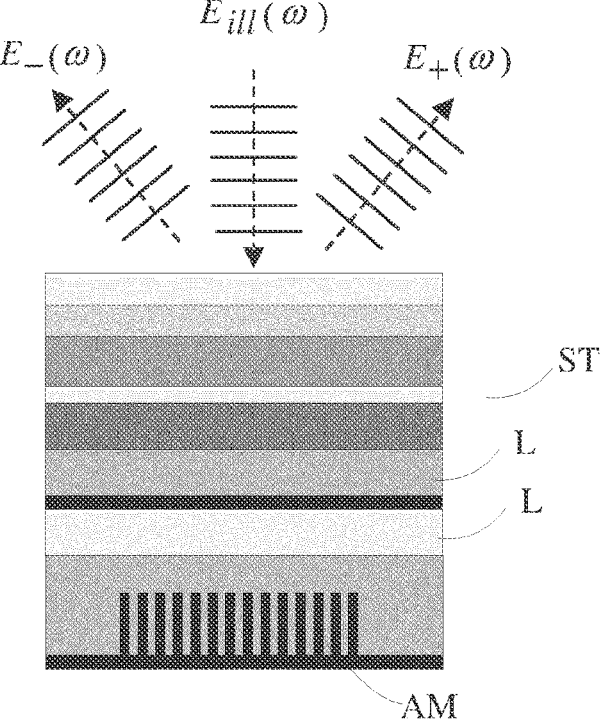
FIG. 4 conceptually illustrates the diffracted fields from measurement of an alignment mark.

FIG. 4 illustrates a measurement of an alignment mark AM. An example stack ST comprises one or more layers L, each having respective properties such as refractive indices and thicknesses, and the alignment mark AM beneath these layers L. The stack is measured using alignment illumination described by a (frequency $\omega$ dependent) electric field $E_{ill}(\omega)$, and the captured diffraction orders are respectively described by electric fields $E_-(\omega)$, $E_+(\omega)$. These field variables are (typically) complex value variables, which comprise both amplitude and phase information on the electric (scalar) field. For an optional (full) vectorial electric field treatment, each (orthogonal) electric field component may be processed individually, in turn. In addition, these individual problems may optionally be coupled, so as to exploit commonalities (e.g. a common dispersion model parameter).

In a recent paper, "A fast Fourier transform implementation of the Kramers-Kronig relations: Application to anomalous and left handed propagation" Lucas et al AIP Advances 2, 032144 (2012) (incorporated herein by reference), the Kramers-Kronig relations have been derived from simple causality considerations. Taking this teaching and applying it to complex fields coming from an alignment mark, a phase offset $\varphi_+(\omega)-\varphi_-(\omega)$, and therefore alignment position deviation (APD) $\Delta(\omega)$, of an alignment mark can be expressed solely in terms of the measured intensities:

$$\varphi_-+(\omega)-\varphi_--(\omega)=1/2''(''\mathrm{Im}''(''''H_-''T(\log(E_-(+1)\{E_-(+1)]|\wedge *)-$$

$$\log(E_-(-1)\{E_-(-1)]|\wedge *)))$$

$$\Delta(\omega)=P/8\pi n''(''\mathrm{Im}''(''''H_-''T(\log(I_-(+1))-\log(I_-(-1))))$$

where $H_T$ is the Hilbert transform: see sections II.A and II.B from the aforementioned Lucas article. Note the Im( ) operator is not essential, it is added to suppress numerical noise.

This formula was used in WO2021/122016 to compute an expected alignment error based on intensity asymmetries measured on that specific alignment mark for a number of different illumination conditions. This document describes using a Kramers-Kronig based dispersion relationship to transform measured intensity asymmetry information into phase/position information and vice versa. Such methods make use of a dispersion transform relation that exists between the measured pupil intensity asymmetry and the position error due to mark deformation (target deformation or structure deformation). This enables correction of the measured alignment mark position for any mark deformation, via transforming the measured intensity asymmetry into a position correction.

However, there is a drawback in the methods disclosed in WO2021/122016. While the physics behind the concepts described therein is sound, there are practical limitations when applying the concepts to alignment metrology in a real-world setting. In particular, there are only a limited number of wavelengths (e.g., 12 discrete wavelengths in the visible range) available for a measurement. This may lead to an incorrect or partial interpretation of a dispersion Lorentz oscillator (just) outside of the visible wavelength range, and under-sampling of dispersion swing curve. The root cause of these issues is that the dispersion relation transform (for full accuracy) requires knowledge of (for example) the measured input data (e.g., intensity asymmetry) for all wavelengths, from zero to infinity.

As the dispersion transforms can be stated in terms of Fourier transforms, these dispersion relations are linear (as is the Fourier transform). As such, it is proposed herein to exploit only (or mainly) the linearity of the dispersion relations, without making (mostly) use of the dispersion transform relations themselves. This allows the computation of the unknown wafer deformations (e.g., of typically one whole wafer) to be posed (for example) as a rank minimization problem. In order to exploit the linearity, the proposed methodology requires measurements of multiple alignment marks located on a single wafer or more wafers.

The intensity asymmetry measurements indicate the number of dispersion eigenvectors required to decompose the mark deformation induced dispersion across the wafer. An incorrectly calculated wafer deformation will likely increase this number of dispersion eigenvectors. This increase can be even better observed when both polarizations are included and/or when more than one target type is measured per wafer location (multi-target).

The main embodiments described relate to the use of intensity asymmetry information and therefore alignment sensors capable of measuring intensity asymmetry. However, it should be appreciated that the rank minimization method described herein also implies the possibility that the same approach may be employed in the absence of intensity asymmetry measurements data; e.g., when using an SRI based alignment sensor such as illustrated in FIG. 3.

Some of the basic physics behind the concepts disclosed herein (and WO2021/122016) will now be described. Referring back to FIG. 4, the diffracted (complex) fields $E_-(\omega)$, $E_+(\omega)$ can be described by:

$$E_+(\omega) = \sqrt{I_+(\omega)} \cdot e^{i \cdot \varphi_+(\omega) + \omega t}$$
$$E_+(\omega) = \sqrt{I_+(\omega)} \cdot e^{i \cdot \varphi_-(\omega) + \omega t}$$

The alignment sensor may measure the diffraction order phase difference $\varphi_+(\omega)-\varphi_-(\omega)$, which yields the measured position deviation:

$$\Delta(\omega) = \frac{P}{4\pi} \cdot (\varphi_+(\omega) - \varphi_-(\omega))$$

where P is the mark pitch.

This measured position deviation is a combination of wafer deformation $\Delta_{WD}$, which is mechanical and therefore not wavelength dependent, and mark deformation $\Delta_{MD}(\omega)$, which is wavelength dependent:

$$\Delta(\omega) = \text{sgn}(\omega) \cdot \Delta_{WD} + \Delta_{MD}(\omega)$$

It is the wafer deformation that is the parameter of interest, while the mark deformation is a nuisance parameter. Consequently, an aim of the proposed method is to determine the wafer deformation by itself, without the mark deformation impact.

In addition to measuring the phase difference $\varphi_+(\omega)-\varphi_-(\omega)$, an alignment sensor may comprise alignment channels to measure the intensity $I_+(\omega)$, $I_-(\omega)$ of each of the diffraction orders individually, or sum of the intensities of two or more positive and negative diffraction orders. Intensity channels are sensitive for mark deformation $\Delta_{MD}(\omega)$ and insensitive for wafer deformation $\Delta_{WD}$ as wafer deformation (i.e., a grating position shift) impacts the diffraction order phase only.

The Fourier transform $F^{-1}\{E_+(\omega)\}(t)$ is causal and it can be mathematically proven that $F^{-1}\{\log(E_+(\omega)\}(t)$ is causal.

Based on the measured signals $\varphi_+(\omega)-\varphi_-(\omega)$, $I_+(\omega)$, $I_-(\omega)$, a coupling function $G(\omega)$ may be constructed having a causal Fourier transform $F^{-1}\{G(\omega)\}(t)$:

$$G(\omega) = \alpha(\omega) + i(\Delta(\omega) - \text{sgn}(\omega) \cdot \Delta_{WD})$$

where $\alpha(\omega)$ is the measured asymmetry indicator:

$$\alpha(\omega) = \frac{P}{8\pi} \cdot \log\left(\frac{I_+(\omega)}{I_-(\omega)}\right)$$

The units of $\Delta_{MD}(\omega)$ and $\alpha(\omega)$ are equal, and $\alpha(-\omega)=\alpha(\omega)$, which follows from time reversal symmetry. A casual signal satisfies g(t)=u(t) g(t), where the impulse response $$u(t) = \begin{cases} 0 \text{ for } t < 0, \\ 1 \text{ for } t > 0 \end{cases}.$$

Fourier transforming this yields the convolution:

$$G(\omega) = \frac{i}{\pi\omega} * G(\omega) = i \cdot H\{G(\omega)\}(\omega)$$

where H{ } denotes the Hilbert transform.

Inserting the coupling function $G(\omega)=\alpha(\omega)+i\cdot(\Delta(\omega)\cdot\text{sgn}(\omega)\cdot\Delta_{WD})$ yields two Plemelj dispersion relations:

$$\Delta(\omega) - \text{sgn}(\omega) \cdot \Delta_{WD} = H\{\alpha(\omega)\}(\omega),$$
$$\alpha(\omega) = -H\{\Delta(\omega) - \text{sgn}(\omega) \cdot \Delta_{WD}\}(\omega)$$

These dispersion relations translate the measured asymmetry indicator $\alpha(\omega)$ into the unknown mark deformation $\Delta(\omega)-\text{sgn}(\omega)\cdot\Delta_{WD}$ and vice versa. Rewriting the first of these dispersion relations into its Kramers-Kronig integral form yields:

$$\Delta_{WD} = \Delta(\omega) - \frac{P}{8\pi} \cdot \int_0^{+\infty} \frac{\omega}{\omega'^2 - \omega^2} \cdot \log\left(\frac{I_+(\omega')}{I_-(\omega')}\right) d\omega'$$

The two Plemelj relations (and therefore mark deformation dispersion) are linear; i.e., $$\text{if } \Delta_{MD,1}(\omega) = H\{\alpha_1(\omega)\}(\omega)$$
$$\text{and } \Delta_{MD,2}(\omega) = H\{\alpha_2(\omega)\}(\omega)$$
$$\text{then } b_1 \cdot \Delta_{MD,1}(\omega) + b_2 \cdot \Delta_{MD,2}(\omega) = H\{b_1 \cdot \alpha_1(\omega) + b_2 \cdot \alpha_2(\omega)\}(\omega),$$
$$\text{and if } \alpha_1(\omega) = -H\{\Delta_{MD,1}(\omega)\}(\omega)$$
$$\text{and } \alpha_2(\omega) = -H\{\Delta_{MD,2}(\omega)\}(\omega)$$
$$\text{then } b_1 \cdot \alpha_1(\omega) + b_2 \cdot \alpha_2(\omega) = -H\{b_1 \cdot \Delta_{MD,1}(\omega) + b_2 \cdot \Delta_{MD,2}(\omega)\}(\omega).$$

Introducing vector notation: $\underline{G}=\underline{\alpha}+i\cdot\underline{\Delta}_{MD}$, where A angular frequencies (wavelengths) are measured such that $\underline{G}\in \mathbb{C}^A$. It therefore can be appreciated that any $\underline{G}=\underline{\alpha}+i\cdot\underline{\Delta}_{MD} \in \mathbb{C}^A$ can be decomposed using only A basis vectors $\underline{v}$, as

13

$\underline{G} = b_1 \cdot \underline{v}_1 + b_2 \cdot \underline{v}_2 + \ldots + b_A \cdot \underline{v}_A$, provided that for each basis vector: $\mathrm{Im}(v(\omega)) = H\{\mathrm{Re}(v(\omega))\}(\omega)$, where Im and Re refer to the imaginary and real parts respectively.

As such, it is proposed to minimize entropy to compute mark deformation. Using matrix notation:

$$\underline{G} = [\underline{G}_1 \underline{G}_2 \ldots \underline{G}_S] = [\underline{\alpha}_1 + i \cdot \Delta_{MD,1} \ \underline{\alpha}_2 + i \cdot \Delta_{MD,2} \ldots \underline{\alpha}_S + i \cdot \Delta_{MD,S}] =$$

$$[\underline{\alpha}_1 + i \cdot (\underline{\Delta}_1 - \Delta_{WD,1}) \ \underline{\alpha}_2 + i \cdot (\underline{\Delta}_2 - \Delta_{WD,2}) \ldots \underline{\alpha}_s + i \cdot (\underline{\Delta}_S - \Delta_{WD,S})]$$

where S sites have been measured on a wafer and therefore $\underline{\underline{G}} \in \mathbb{C}^{A \times S}$. $\underline{\alpha}_1 \ldots \underline{\alpha}_n$ is measured via the intensity channels and $\underline{\Delta}_1 \ldots \underline{\Delta}_S$ is measured via the measured phase offset $\varphi_+(\omega) - \varphi_-(\omega)$; $\Delta_{WD,1} \ldots \Delta_{WD,S}$ is the parameter being sought.

It can be appreciated that the coupling function on which the algorithm disclosed herein is based acts simultaneously on all the wavelengths used. As such, the proposed method may be based on using the measured asymmetry indicator $\alpha(\omega)$ and position deviation data $\Delta(\omega)$ (which may collectively be referred to as alignment data) as input data and solving for the wafer deformation making use of the linearity of the relevant relationships rather than a comprehensive solving of the relationships.

Additionally, while the aforementioned WO2021/122016 used one measurement at a time to calculate wafer deformation, in this example multiple measurements (e.g., from a whole wafer, although they may be from a portion of a wafer or more than one wafer) are used simultaneously. As such, while the proposed method moves away from performing comprehensive Hilbert transforms, this is compensated by using more measurements. In this way, it is possible to describe the whole wafer with limited number of basis functions.

The proposed algorithm (in the example a single polarization and a single target type is shown for simplicity) comprises determining the wafer deformation as that which minimizes the rank of G:

$$[\Delta_{WD,1} \ldots \Delta_{WD,S}]^T = \arg\min \mathrm{rank}\,(\underline{G})$$

The correct wafer deformation minimizes the number of basis vectors (e.g., independent basis vectors and/or at least not completely dependent basis vectors) needed to expand the mark deformation dispersion of a single wafer. This algorithm concept may be expanded to two polarizations (single target type), e.g., by minimizing the sum of the rank of $\underline{G}$ for each polarization state:

$$[\Delta_{WD,1} \ldots \Delta_{WD,S}]^T = \arg\min\left(\mathrm{rank}\left(\underline{G}_{X-pol}\right) + \mathrm{rank}\left(\underline{G}_{Y-pol}\right)\right)$$

The algorithm concept may also be expanded to handle different target types. Two options are proposed to do this. A first option is to treat each additional target types as if they were an additional polarization state in the equation just proposed. A second option is to treat each additional target types as if they were additional wavelengths. The first option comprises determining the rank separately for each combination of polarization and target type. The sum of all rank( ) functions is then minimized. In order for the algorithm to effectively obtain additional information out of the multiple target-types, they should be sufficiently close together on the wafer such it can be assumed that the wafer-deformation of the two targets-types are equal per target-location.

As a further addition, measurements of more than one pair of complementary diffraction orders are also possible. This also leads to additional measurements of phase difference and intensity asymmetry combinations.

By way of a simple example, consider a situation where there is only one type of mark deformation, for example floor tilt, which has a response which is (or is at least assumed to be) linear with the magnitude of the geometric deformation, and which varies across wafer. In such an example, one basis vector $\underline{v}_1$ will be sufficient to expand the mark deformation dispersion over the whole wafer. Recalling that:

$$\underline{G} = [\underline{\alpha}_1 + i \cdot (\underline{\Delta}_1 - \Delta_{WD,1}) \ \underline{\alpha}_2 + i \cdot (\underline{\Delta}_2 - \Delta_{WD,2}) \ldots \underline{\alpha}_s + i \cdot (\underline{\Delta}_S - \Delta_{WD,S})]$$

therefore, for such an example:

$$\underline{G} = \underline{v}_1 [b_{1,1} \ b_{2,1} \ldots \ b_{S,1}]$$

If one or more of the wafer deformations $[\Delta_{WD,1} \ \Delta_{WD,2} \ldots \Delta_{WD,S}]$ are incorrect, then more than one basis vector may be needed. As such, the known origin of the intensity asymmetry is communicated to the unknown origin of the position data. Measuring at least two polarization states will help rule out incorrect solutions, as will measuring more than one target type and/or beginning the algorithm from near the correct solution.

The proposed minimization may be performed in the complex domain as this improves coupling between intensity difference (e.g., the input data or measured asymmetry indicator) and mark deformation. Variation across wafer is limited by small number of statistically independent factors. Therefore it is likely that only one or two basis vectors will be necessary to describe this variation.

The proposed method describes performing a rank minimization of $\underline{G}$ (e.g., per polarization) to determine wafer deformation (free of mark deformation). However, rank minimization is a computationally intensive process, while alignment metrology should be performed as quickly as possible, as it determines a feedforward correction to be used immediately subsequent the alignment metrology, for an exposure on the same wafer. As such, there is only a limited time in which the wafer deformation can be calculated. To address this, in some embodiments, the rank minimization step may be approximated (and therefore replaced by) a minimization of the nuclear norm of $\underline{G}$. Nuclear norm minimization (NNM) is commonly used to approximate the matrix rank by shrinking all singular values equally. Such a method may therefore comprise minimizing the sum of all singular values of $\underline{G}$. As such, the proposed

US 12,607,946 B2

15 algorithm (for a single polarization and a single target type) may comprise determining:

$$[\Delta_{WD,1} \ \dots \ \Delta_{WD,S}]^T = \arg\min \left( \|\underline{G}^T\|_* \right)$$

where:

$$\underline{G} =$$

$$\left[ \underline{\alpha}_1 + i \cdot (\Delta_1 - \Delta_{WD,1}) \underline{\alpha}_2 + i \cdot (\Delta_2 - \Delta_{WD,2}) \ \dots \ \underline{\alpha}_S + i \cdot (\Delta_S - \Delta_{WD,S}) \right] \in \mathbb{C}^{A \times S}$$

and:

$$\|\underline{G}^T\|_* = \sum_{a=1}^{A} \sigma_a(\underline{G}^T),$$

with $$A \le S$$

Where $\sigma_a$ comprises a singular value of $\underline{G}$. Once again, the algorithm will perform better for a good initial estimate of $[\Delta_{WD,1} \dots \Delta_{WD,S}]^T$ to begin the estimation. More than one iterations of the method may be performed, where, in each iteration after the first iteration, the determined substrate deformation metric values output from the previous iteration are used as the estimated substrate deformation metric values for the next iteration.

The disclosure above is based on image based sensors and intensity measurements (e.g., intensity asymmetry data) However, the methods disclosed herein can also be applied using only phase channel data from a self-referencing interferometer based device (i.e., without intensity asymmetry data). As such, the method uses at least phase offset data, which may be complemented with intensity asymmetry data.

While specific embodiments have been described above, it will be appreciated that the disclosed technology may be practiced otherwise than as described.

While the above concepts are described in terms of wafer alignment, they are applicable to other metrology aspects such as, for example: 1) overlay metrology, 2) focus metrology and 3) wafer levelling.

Although specific reference may have been made above to the use of embodiments in the context of optical lithography, it will be appreciated that the disclosed embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

Embodiments of the present disclosure can be further described by the following clauses.

1. A method of determining a substrate deformation metric relating to at least one substrate, the substrate deformation metric describing deformation across the at least one substrate, the method comprising:
   obtaining alignment data relating to measurement of a plurality of structures on said substrate using a plurality of illumination conditions; and
   determining substrate deformation metric values for the substrate deformation metric which minimizes the number of basis vectors which are required to expand dispersion due to structure deformation of said plurality of structures.

2. A method as in clause 1, wherein said alignment data comprises at least:
   asymmetry data related to a difference or imbalance between the respective phases and/or intensities or amplitudes of at least one pair of complementary diffraction orders or at least one pair of complementary sums of diffraction orders of radiation diffracted by each said structure; and
   phase offset data related to a phase offset between said at least one pair of complementary diffraction orders.

3. A method as in clause 2, wherein the step of determining substrate deformation metric values comprises determining substrate deformation metric values which minimize the rank or nuclear norm or sum of one or more singular values of a linear coupling function, said linear coupling function describing a relationship between said asymmetry data and said structure deformation.

4. A method as in clause 3, wherein said plurality of illumination conditions relate to a plurality of illumination and/or detection polarization states; and
   said determining substrate deformation metric values comprises determining substrate deformation metric values which minimize the rank of a linear coupling function per said polarization state.

5. A method as in clause 3 or 4, wherein said linear coupling function couples the alignment data from all of said structures.

6. A method as in any of clauses 3 to 5, wherein said linear coupling function couples the alignment data over all of said illumination conditions.

7. A method as in any of clauses 3 to 6, wherein said asymmetry data relates to a difference or imbalance between the respective phases and/or intensities or amplitudes of a plurality of pairs of complementary diffraction orders; and
   said linear coupling function couples the alignment data over all of said pairs of complementary diffraction orders.

8. A method as in any of clauses 3 to 7, wherein said linear coupling function comprises a combination of multiple ranks, nuclear norms and/or a sum of singular values thereof.

9. A method as in any preceding clause, wherein said plurality of illumination conditions relate to a plurality of wavelengths.

10. A method as in clause 9, wherein the number of wavelengths is greater than the number of structures on the substrate.

11. A method as in clause 9 or 10, wherein said plurality of structures number more than said plurality of wavelengths.

12. A method as in any preceding clause, comprising an initial step of estimating the substrate deformation metric values and using the estimated substrate deformation metric values in said step of determining substrate deformation metric values.

13. A method as in clause 12, wherein said initial step of estimating the substrate deformation metric values comprises performing more than one iterations of said method, and in each iteration after the first iteration, using the determined substrate deformation metric values output from the previous iteration as the estimated substrate deformation metric values.

14. A method as in any preceding clause, wherein said plurality of structures comprises structures of more than one type.

15. A method as in any preceding clause, wherein said step of determining substrate deformation metric values is performed in the complex domain.

16. A method as in any preceding clause, wherein said plurality of structures comprise a plurality of alignment marks.

17. A method as in clause 16, comprising determining an alignment correction for a subsequent lithographic exposure based on the determined substrate deformation metric values.

18. A computer program comprising program instructions operable to perform the method of any of clauses 1 to 17, when run on a suitable apparatus.

19. A non-transient computer program carrier comprising the computer program of clause 18.

20. A processing system comprising a processor and a storage device comprising the computer program of clause 18.

21. An alignment sensor comprising a processing system as in clause 20.

22. A lithographic apparatus comprising:

a patterning device support for supporting a patterning device;

a substrate support for supporting a substrate; and the alignment sensor of clause 21.

The breadth and scope of the present invention should not be limited by any of the above-described exemplary embodiments, but should be defined only in accordance with the following claims and their equivalents.

The invention claimed is:

1. A non-transitory computer-readable medium storing instructions that are executable by one or more processors of a system to cause the system to perform operations for generating a substrate deformation metric relating to a substrate using an alignment sensor, the operations comprising:

controlling the alignment sensor to obtain alignment data relating to measurement of a plurality of structures on said substrate using a plurality of illumination conditions; and determining substrate deformation metric values for the substrate deformation metric which minimizes the number of basis vectors which are required to expand dispersion due to structure deformation of said plurality of structures.

2. The non-transitory computer-readable medium of claim 1, wherein said alignment data comprises at least:

asymmetry data related to a difference or imbalance between the respective phases and/or intensities or amplitudes of at least one pair of complementary diffraction orders or at least one pair of complementary sums of diffraction orders of radiation diffracted by each said structure; and phase offset data related to a phase offset between said at least one pair of complementary diffraction orders.

3. The non-transitory computer-readable medium of claim 2, wherein the step of determining substrate deformation metric values comprises determining substrate deformation metric values which minimize a rank or nuclear norm or sum of one or more singular values of a linear coupling function, said linear coupling function describing a relationship between said asymmetry data and said structure deformation.

4. The non-transitory computer-readable medium of claim 3, wherein said plurality of illumination conditions relate to a plurality of illumination and/or detection polarization states; and said determining substrate deformation metric values comprises determining substrate deformation metric values which minimize the rank of a linear coupling function per said polarization state.

5. The non-transitory computer-readable medium of claim 3, wherein said linear coupling function couples the alignment data from all of said structures.

6. The non-transitory computer-readable medium of claim 3, wherein said linear coupling function couples the alignment data over all of said illumination conditions.

7. The non-transitory computer-readable medium of claim 3, wherein said asymmetry data relates to a difference or imbalance between the respective phases and/or intensities or amplitudes of a plurality of pairs of complementary diffraction orders; and said linear coupling function couples the alignment data over all of said pairs of complementary diffraction orders.

8. The non-transitory computer-readable medium of claim 3, wherein said linear coupling function comprises a combination of multiple ranks, nuclear norms and/or a sum of singular values thereof.

9. The non-transitory computer-readable medium of claim 1, wherein said plurality of illumination conditions relate to a plurality of wavelengths.

10. The non-transitory computer-readable medium of 1, wherein determining substrate deformation metric values further comprises estimating the substrate deformation metric values and using the estimated substrate deformation metric values.

11. The non-transitory computer-readable medium of 10, wherein estimating the substrate deformation metric values comprises performing more than one iterations of the controlling and determining operations, and in each iteration after a first iteration, using the determined substrate deformation metric values output from a previous iteration as the estimated substrate deformation metric values.

12. The non-transitory computer-readable medium of claim 1, wherein said plurality of structures comprises structures of more than one type.

13. The non-transitory computer-readable medium of claim 1, wherein said plurality of structures comprise a plurality of alignment marks.

14. The non-transitory computer-readable medium of 13, wherein the operations further comprise determining an alignment correction for a subsequent lithographic exposure based on the determined substrate deformation metric values.

15. A lithographic apparatus comprising:

a patterning device support for supporting a patterning device;

a substrate support for supporting a substrate;

an alignment sensor for obtaining the alignment data; and one or more processors configured to execute instructions to cause the lithographic apparatus to perform operations for generating a substrate deformation metric relating to the substrate using the alignment sensor, the operations comprising:

controlling the alignment sensor to obtain alignment data relating to measurement of a plurality of structures on said substrate using a plurality of illumination conditions; and determining substrate deformation metric values for the substrate deformation metric which minimizes the number of basis vectors which are required to expand dispersion due to structure deformation of said plurality of structures.

16. The apparatus of claim 15, wherein said alignment data comprises at least:

asymmetry data related to a difference or imbalance between the respective phases and/or intensities or amplitudes of at least one pair of complementary diffraction orders or at least one pair of complementary sums of diffraction orders of radiation diffracted by each said structure; and phase offset data related to a phase offset between said at least one pair of complementary diffraction orders.

17. The apparatus of claim 16, wherein determining substrate deformation metric values comprises determining substrate deformation metric values that minimize a rank or nuclear norm or sum of one or more singular values of a linear coupling function, said linear coupling function describing a relationship between said asymmetry data and said structure deformation.

18. The apparatus of claim 17, wherein said plurality of illumination conditions relate to a plurality of illumination and/or detection polarization states; and said determining substrate deformation metric values comprises determining substrate deformation metric values which minimize the rank of a linear coupling function per said polarization state.

* * * * *